United States Patent [19]

Hunsinger

[11] 4,143,340
[45] Mar. 6, 1979

[54] ACOUSTIC SURFACE WAVE DEVICE WITH IMPROVED TRANSDUCER

[75] Inventor: Bill J. Hunsinger, Mahomet, Ill.

[73] Assignee: The Magnavox Company, Fort Wayne, Ind.

[21] Appl. No.: 719,552

[22] Filed: Sep. 1, 1976

[51] Int. Cl.² .................. H03H 9/04; H03H 9/26; H03H 9/30; H01L 41/10
[52] U.S. Cl. .................................. 333/151; 310/313; 310/366; 333/194
[58] Field of Search ............... 333/72, 71, 30 R, 70 T; 310/8, 8.1, 8.2, 9.5, 9.7, 9.8, 313, 365, 366; 235/181; 331/107 A; 330/5.5

[56] References Cited

U.S. PATENT DOCUMENTS

| 3,633,132 | 1/1972 | Hartemann | 333/30 R |
| 3,831,116 | 8/1974 | Davis, Jr. et al. | 333/72 |
| 3,894,251 | 7/1975 | Shibayama et al. | 310/9.8 |
| 3,931,597 | 1/1976 | Cho et al. | 333/30 R |
| 4,006,438 | 2/1977 | Bennett | 333/72 |

Primary Examiner—Alfred E. Smith
Assistant Examiner—Marvin Nussbaum
Attorney, Agent, or Firm—Thomas A. Briody; William J. Streeter; William J. Iseman

[57] ABSTRACT

An acoustic surface wave device having a substrate of a material capable of propagating acoustic surface wave energy. At least one electro-acoustic transducer coupled to a region of a surface of the substrate. The transducer has a first and a second bus bar positioned parallel and a distance from each other. A plurality of electrodes extend from each bus bar. The electrodes from the first bus bar are opposite to the electrodes of the second bus bar with the electrodes from one of the bus bars being forked and surrounding the electrode located in an opposite relationship thereto, thus, reducing substantially any synchronous reflections.

12 Claims, 4 Drawing Figures

ACOUSTIC SURFACE WAVE DEVICE WITH IMPROVED TRANSDUCER

BACKGROUND OF THE INVENTION

The present invention relates to surface wave devices. More particularly, the present invention relates to an improved electro-acoustic transducer structure for acoustic surface wave devices.

Much work has been done recently to improve the performance of surface wave devices. Basically a surface wave device consists of a smooth substrate of a piezoelectric type material capable of propagating acoustic surface waves. Electro-acoustic transducers are attached to or held in intimate contact with the substrate in order to convert electrical rf energy to surface waves on the substrate. When an electro-magnetic field is impressed on the piezoelectic material, a physical deformation of the material results. If the electro-magnetic field is made time-variant the resulting deformation will also be time-variant. The deformation effects will propagate through the material as acoustic or sound waves, much like sonar waves, through water. A second electro-acoustic transducer held in intimate contact with the substrate will sense the deformation effects and convert the surface wave into an electrical rf energy.

One of the significant advantages of surface wave devices is that surface acoustic waves travel considerably slower on the substrate than do electro-magnetic waves in free space. This causes the wavelengths to be far shorter and devices such as filters, delay lines, and couplers can be miniaturized using surface wave technology. In the past, one significant problem which was encountered in the design of surface wave devices, such as low shaped factor bandpass filters with accurately control frequency response characteristics, was synchronous reflection. During the operation of surface wave device transducers, the electrodes provide effective acoustic wave impedance discontinuities along the substrate surface causing reflection of surface waves. These reflections will add in-phase, in prior art transducers having electrode widths and spacings of one quarter wavelength along the direction of propagation, thus creating a large amplitude reflective wave which results in frequency response distortion in the bandpass filter or in a delay line employing these transducers.

One prior art solution to this reflection problem consisted of using a double finger electrode with one-eighth wavelength width interdigital fingers used in pairs. The use of one-eighth wavelength width fingers, however, significantly limits the upper frequency at which a surface wave device can be fabricated due to practical limitations encountered in making transducer fingers of sufficiently small dimensions.

Another solution that has been proposed in the past consisted of using the double finger electrode geometry in a transducer operating at the third harmonic of its fundamental spacing as taught in U.S. Pat. 3,803,520 which issued to Thomas Bristol, et al. This technique allows a fabrication of a surface wave device at three times the frequency which would be possible with a double finger transducer electrode operated at its fundamental frequency. However, this technique results in a loss of tap weight accuracy and reduced efficiency in the generation of surface waves on the substrate which tends to result in the inability to control the frequency response, shape factor, and low level sidelobes particularly those greater than 35 db below the peak response of the surface wave device being fabricated.

Furthermore, the fabrication of low shape factor filters with low level sidelobes requires the use of one or more accurate tap weighted transducers. Tap weighted transducers are those in which both the phase and amplitude of energy launched by each electrode onto the substrate surface is accurately controlled in order to shape the impulse response of the filter or delay line being fabricated. This in turn shapes the frequency response of the given device which is mathematically related to the impulse response by the Fourier Transform.

In the design of bandpass filters requiring low shape factors and low sidelobe levels it is sometimes necessary to incorporate two weighted tap transducers, one to act as the input transducer and the other as the output transducer since sidelobe levels below approximately 30 db cannot be readily achieved using only one weighted transducer. At least one of these transducers must be capable of integrating the surface wave energy across the width of the beam. Thus a series weighted transducer is generally used for at least one of the required transducers and either a series weighted, modified series weighted, or overlap weighted transducer may be used for the other transducer as taught in "Design Problems in Surface Wave Filters" by Ronnekleiv, Skeie and Hanebrekke; IEE International Specialists Seminar on Component Performance and Systems Applications of Surface Acoustic Wave Devices, Aviemore, Scotland, Pages 141—151, 1973.

In order to achieve the highest possible operating frequency while controlling the frequency response and sidelobe levels of the surface wave devices accurately, an electrode structure is required which can be used in all types of amplitude weighted transducers, which gives reflection suppression and has relatively large finger widths compared to an acoustic wavelength.

In view of the foregoing, it should now be understood that it would be desirable to provide a surface wave device having an improved electro-acoustic transducer.

Accordingly, one of the objects of the present invention is to provide a surface wave device having a reflectionless transducer which does not employ the double finger configuration.

Another object of the invention is to provide a surface wave device having an electro-acoustic transducer electrode which can be implemented in all types of amplitude weighted transducers and more specifically overlap and series weighted transducers and variations thereof.

Yet another object of this invention is to provide a reflectionless transducer electrode having a reduced fabrication resolution equipment.

Still another object of the invention is to provide a surface wave transducer capable of operating at higher frequencies than heretofore possible while maintaining high efficiency conversion of rf to surface wave energy and accurate control of the frequency and impulse responses of a surface wave device in which the transducer is being used.

SUMMARY OF THE INVENTION

In carrying out the above and other objects of the invention in one form, I provide an improved surface wave device. One illustrated acoustic surface wave device comprises the substrate of a material capable of propagating acoustic surface wave energy and at least one electro-acoustic transducer coupled to a region of a surface of the substrate. The transducer has a first and a second bus bar. The first bus bar and the second bus bar are spaced apart and in parallel relationship and each bus bar has a plurality of electrodes extending therefrom. The electrodes from the first bus bar are opposite to the electrodes from the second bus bar. Some of the electrodes from one of the bus bars are forked so that the tines of the fork surround the electrode located opposite thereto. The overlap of the tines and the electrode determines the weighting for the tap formed by the forked electrode and opposite electrode.

Another embodiment of the improved surface wave device comprises an electro-acoustic transducer wherein some of the taps have a series of forked electrodes between the first and second bus bar. In such an arrangement a first electrode having the forked configuration is attached to a bus bar with a second forked electrode placed in series with the first electrode wherein the handle of the second forked electrode is positioned between the tines of the first forked electrode. The tines of the last or second forked electrode surround a straight electrode which is physically attached to a second bus bar. A tap made in this manner can have one or more forked segments between the bus bars.

Preferably the electrodes are one-sixth wavelength ($\lambda/6$) in width with the spacing between the tines of the fork and the electrode surrounded by the tines being one-sixth wavelength ($\lambda/6$) also.

The subject matter which I regard as my invention is set forth in the appended claims. The invention itself, however, together with further objects and advantages thereof, may be better understood by referring to the following description taken in conjunction with the accompanying drawings.

The exemplifications set out herein ilustrate the preferred embodiments of the invention in one form thereof, and such exemplifications are not to be construed as limiting in any manner.

DESCRIPTION OF THE PREFERRED EMBODIMENTS

Figure 1:
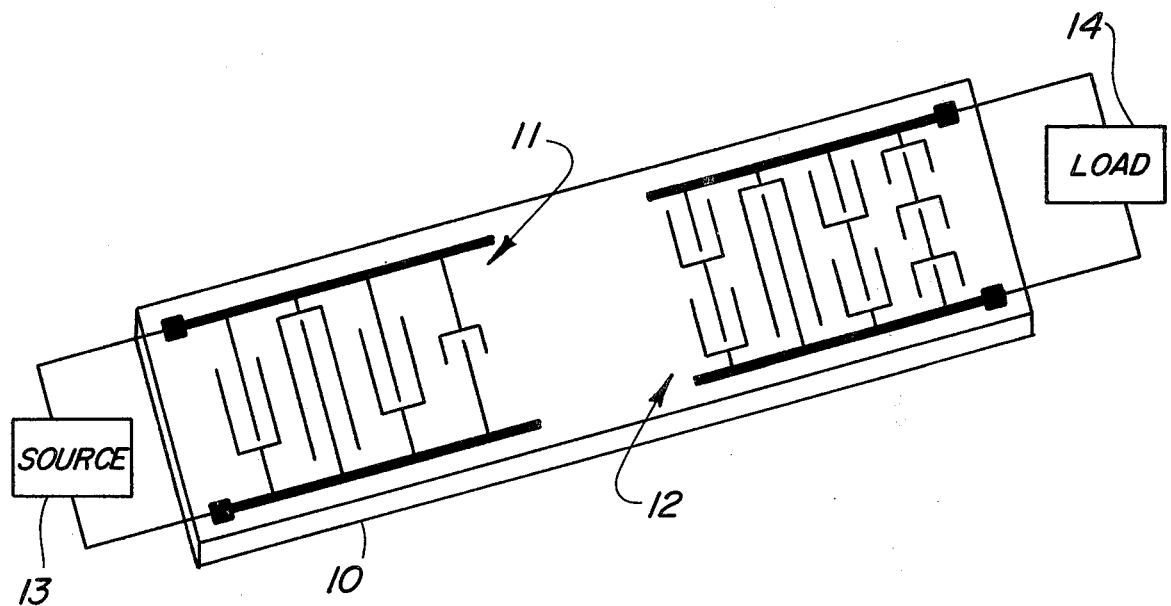
FIG. 1 is a simplified pictorial view illustrating a surface wave device having transducers constructed in accordance with the present invention.

FIG. 1 shows in simplified form an acoustic surface wave device embodying the present invention in one form thereof. The device includes a piezoelectric substrate 10 which may be a crystal of lithium niobate, quartz, bismuth geranium oxide, or any other suitable piezoelectric material. The device also includes a first transducer 11, which illustrates one embodiment of the invention, and a second transducer 12, which illustrates a second embodiment of the invention. The first transducer 11 is illustrated as being an input transducer having as rf signal source 13 connected thereto. Transducer 12 is illustrated as being an output transducer and being connected to an electrical load 14.

It will be noted that the transducers of FIG. 1 contain electrodes of a forked configuration. Surface wave filter responses can be degraded by reflections and diffraction resulting from weighted quarter wavelength wide tranducer electrodes. In the present invention, each tap is made into a reflection free unit by varying the number of electrodes and by adjusting the line and gap width. Surface acoustic wave bandpass filter design techniques must take into account the acoustic reflections caused by transducer structures on the substrate and the variation of tap effectiveness by diffraction spreading of the acoustic beam as it propagates along the path of the tranducer. The present invention reduces the design problem by choosing a transducer structure which minimizes acoustic reflections and is less sensitive to diffraction spreading of the acoustic beam.

Figure 2:
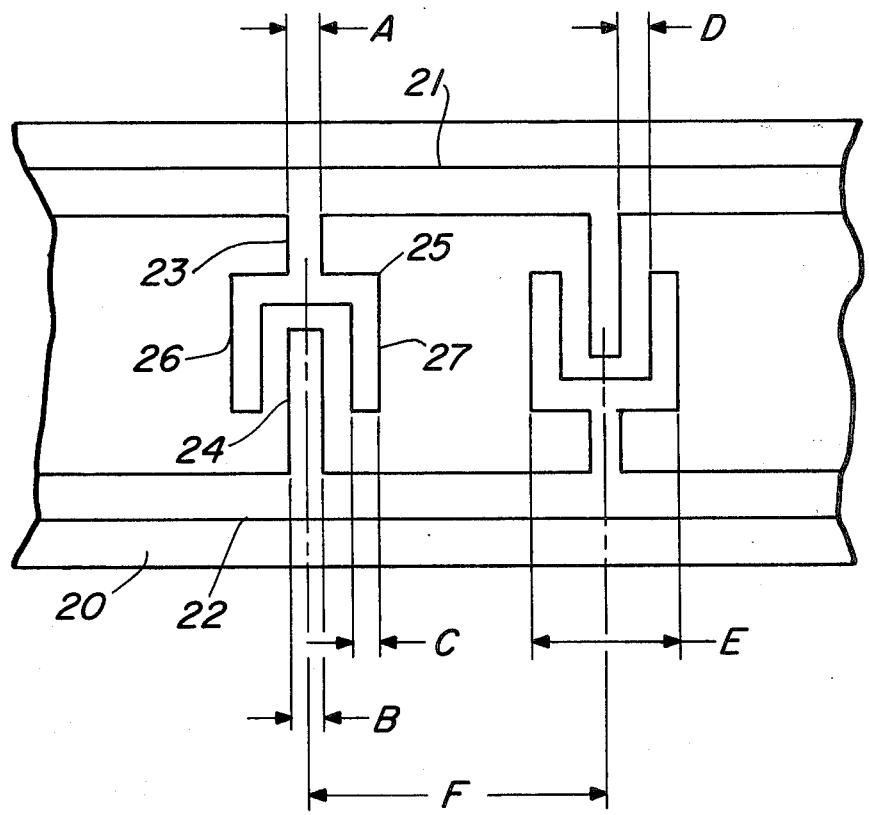
FIG. 2 is an expanded view of a portion of a transducer of a surface wave device illustrating the invention in one form.

In FIG. 2 a portion of a surface wave device is shown. The portion has two adjacent taps. The taps consist of three lines, two gaps, and have a tuning fork appearance. The taps are formed of any suitable electrically conductive material such as aluminum or gold. The taps are part of a transducer which is deposited, bonded, or otherwise attached to the piezoelectric substrate 20. A transducer typically has two parallel elongated bus bars such as 21 and 22. Electrode 25 is electrically connected to bus bar 21 while electrode 24 is electrically connected to bus bar 22 and these two electrodes 24, 25 form one tap. Electrode 25 has three portions which give it the tuning fork appearance. On portion 23 appears to be a handle while portions 26 and 27 appear to be tines of a tuning fork. The tine portions 26, 27 surround electrode 24. The width of the tines, indicated as C is one-sixth wavelength ($\lambda/6$). The width of the handle portion 23 is indicated by A and is one-sixth wavelength ($\lambda/6$) as is the width of electrode 24 indicated by B. The spacing between the tines and the electrode is indicated as D and is also one-sixth wavelength. It then follows that the width of the forked electrode, indicated as E, would be five-sixth wavelength (5 $\lambda/6$). The distance between the two taps is indicated as F and is equal to one and a half wavelength (3 $\lambda/2$). Those persons skilled in the art will recognize that the wavelength $\lambda$ is the wavelength of the center frequency of the transucer.

Figure 3:
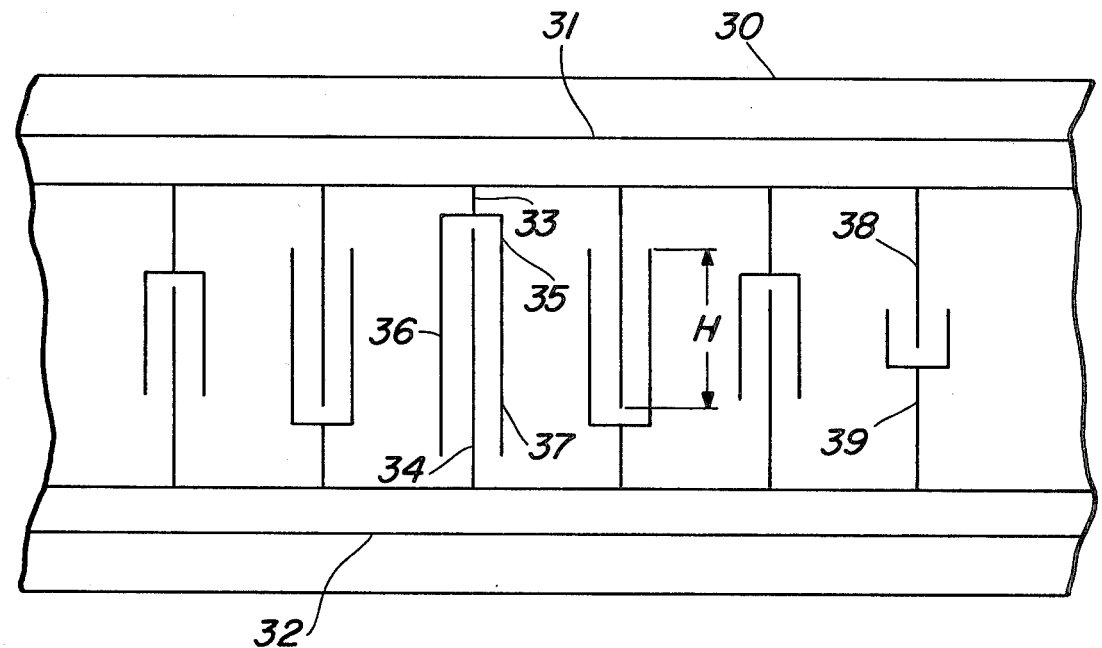
FIG. 3 is a simplified view illustrating a greater portion of the transducer of FIG. 2.

FIG. 3 illustrates in simplified form a larger portion of a surface wave device having a piezoelectric substrate 30. A portion of a transducer deposited on substrate 30 is illustrated as having bus bars 31 and 32 with a plurality of electrodes extending from the bus bars. A pair of the electrodes connected to bus bars 31 and 32 form a tap. Electrodes 34 and 35 being an example of a tap. Electrode 35 has the appearance of a tuning fork with a handle 33 and tines 36 and 37. The tines 36 and 37 surround electrode 34. It should be noted that electrode 34 is opposite to handle 33 of electrode 35, and the tap formed by electrodes 34, 35 appears to have three fingers. These three fingers are tines 36, 37, and electrodes 34. Another tap is formed by another pair of electrodes, such as electrodes 38 and 39. Electrode 39 does not overlap electrode 38 as much as electrode 35 overlaps electrode 34. The amount of the overlap is illustrated as being H and determines the weight of the tap. Accordingly, the greater the overlap the greater the weight of the tap and conversely the less the overlap the lower the weight of the tap. It will be noted that one tap has its tuning fork configured electrode connected to a first bus bar while the adjacent tap has its tuning fork configured electrode connected to a second bus bar. The polarity of the tap is determined by which bus bar the tuning fork configured electrode is connected to. If it were desired to have two adjacent taps with the same polarity then both taps would have their forked electrode connected to the same bus bar.

Figure 4:
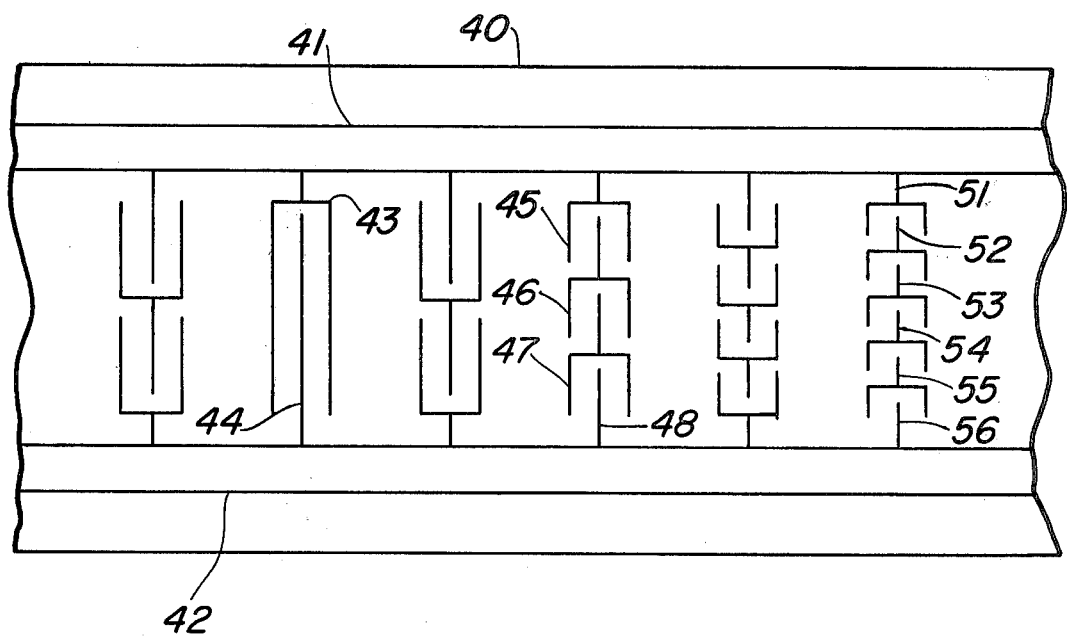
FIG. 4 illustrates in simplified form another embodiment of an improved electro-acoustic transducer for a surface wave device.

FIG. 4 shows a portion of a simplified version of another embodiment of a surface wave device with an improved transducer. Bus bars 41 and 42 are deposited on substrate 40. the bus bars 41 and 42 have a plurality of electrodes therebetween. One tap can consist of electrodes 43 and 44 wherein electrode 43 is of the forked configuration. Yet another tap can consist of an electrode 48 and a series of segments or portions forming forked electrodes 45, 46, and 47. It should be noted that only forked electrode 45 of this tap having a series of forked segments is physically connected to bus bar 41 while forked electrodes 46 and 47 are not physically connected to bus bar 41. The section forming forked electrode 46 is electrically coupled to electrode 46 although it is not physically attached to electrode 45. Another tap is illustrated as consisting of electrode 56 and forked segments 51, 52, 53, 54 and 55. The number of forked segments per tap depends upon the weighting desired for that particular tap. The weighting is equal to 1/n where n is equal to the number of segments or forks. The number of series forks could be as high as 20 although this depends upon the width of the surface wave device.

The width of all the electrodes including the tines and handles are all one-sixth wavelength ($\lambda/6$). Typically, the taps are spaced one and a half wavelength apart center to center along the longitudinal axis of the bus bars. The resulting taps of the present invention require approximately thirty-three percent less photo mask resolution than the double electrode structure discussed hereinabove which required electrodes having a width of one-eighth wavelength. An electro-acoustic transducer having the improved forked configured taps can use a combination of series weighting and overlap weighting taps to suppress diffraction affects. A tap using the forked electrode has been found to have a reflection function having a null at the center frequency.

Electro-acoustic transducers having forked electrodes in accordance with the present invention have been found to operate best if the center line separation of the taps is at least one and a half wavelength apart. It follows from sampling theory that images will arise at third subharmonics of the passband but these are highly suppressed by the tap transfer function. Series weighted taps are less sensitive to diffraction errors than the standard overlap weighted tap because the surface wave beam is sensed uniformly all across the length of the series weighted tap, however, it is limited in that only weights of reciprocal integers can be realized.

A surface wave filter having a series weighted forked configured transducer driving an overlapped weighted forked configured transducer was tested. Since all taps of the series weighted forked configured transducer have nearly constant sensitivity across the surface wave beam, the one-half bandwidth modulation of the sampling function due to diffraction of the resulting sidebands were absent as expected. The tested surface wave filter demonstrated that the upper frequency bound of filters with low shape factors and flat bandpasses was increased by approximately thirty-three percent above the photo mask resolution required for the double finger configuration. Accordingly, one of the advantages of the forked configured electrode is that transducers responsive to higher frequencies can be manufactured with optical fabrication resolution that would heretofore have been used to fabricate surface wave transducers of lower frequency response. The forked configured transducer effectively suppresses reflection. The series weighted forked transducer significantly reduces the degrading effects of diffraction on the overall response of surface wave filters.

Consequently, while in accordance with the Patent Statutes, I have described what at present are considered to be the preferred forms of my invention it will be obvious to those skilled in the art that numerous changes and modifications may be made herein without departing from the spirit and scope of the invention, and it is therefore aimed in the following claims to cover all such modifications.

What I claim as new and desire to secure by Letters Patent of the United States is:

1. An Acoustic surface wave device comprising: a substrate of a material capable of propagating acoustic surface wave energy; at least one electro-acoustic transducer coupled to a region of a surface of the substrate; and the transducer including a first and a second bus bar positioned parallel and a distance from each other, the first bus bar having a plurality of electrodes spaced apart and extending toward the second bus bar, and the second bus bar having a plurality of electrodes extending toward the first bus bar, a predetermined number of the plurality of electrodes of the second bus bar having a forked configuration so that each of the electrodes of the first bus bar opposite a forked electrode is positioned within the forked configuration with preselected ones of the electrodes of the first bus bar being positioned further within the opposing forked configuration than other electrodes of the first bus bar.

2. The acoustic surface wave device of claim 1 wherein the predetermined number of electrodes is every other electrode and wherein electrodes of the first bus bar adjacent to a forked configured electrode of the second bus bar is also forked and positioned opposite to an electrode of the second bus bar which is of a straight configuration.

3. An acoustic surface wave device, comprising: a substrate of a material capable of propagating acoustic surface wave energy, at least one electro-acoustic transducer coupled to a region of a surface of the substrate; the transducer including a first and a second bus bar, the first bus bar and the second bus bar being spaced apart and in parallel relationship; and a plurality of electrodes extending from each bus bar, the electrodes from the first bus bar being opposite to the electrodes from the second bus bar with the electrodes from one of the bus bars being forked and surrounding the electrode located in an opposite relationship a predetermined amount, a weighting of an electrode surrounded by a forked electrode being determined by a length of the forked electrode.

4. An acoustic surface wave device, comprising: a substrate of a material capable of propagating acoustic surface wave energy; at least one electro-acoustic transducer coupled to a region of a surface of the substrate; and the transducer having two bus bars spaced apart and in a parallel relationship and having a plurality of electrodes extending from each bus bar, at least one of the electrodes from one of the bus bars being opposite an electrode from another of the bus bars, the at least one of the electrodes including a series of individual segments wherein each segment forms a fork having a handle and two tines, the segments being positioned so that the handle of one fork is surrounded by the tines of an adjacent fork.

5. An acoustic surface wave device, comprising: a substrate of a material capable of propagating acoustic surface wave energy; and at least one electro-acoustic transducer coupled to a region of a surface of the substrate, the transducer having a plurality of taps, at least one of the taps having a plurality of segments, each segment being in a forked configuration, each segment having a handle and two tines and the segments being arranged so that the tines from one segment surround the handle from an adjacent segment.

6. The acoustic surface wave device of claim 5 further being responsive to a periodic wave having a predetermined wavelength so that the handle and each tine from each segment is one-sixth wavelength wide, and wherein spacing between the handle from an adjacent segment and the tines surrounding the handle is one-sixth wavelength.

7. An acoustic surface wave device, comprising: a substrate of a material capable of propagating acoustic surface wave energy: and at least one electro-acoustic transducer coupled to a region of a surface of the substrate, the transducer being responsive to a predetermined frequency having a predetermined wavelength, the transducer having a plurality of taps, at least one of the plurality of taps having at least one forked electrode with another electrode positioned within the fork of the at least one forked electrode, the at least one forked electrode having tines and a handle portion of one-sixth wavelength in width and the another electrode also being one-sixth wavelength wide, and the another electrode being positioned one-sixth wavelength from the surrounding tines.

8. An acoustic surface wave device, comprising: a substrate of a material capable of propagating acoustic surface wave energy; at least one electro-acoustic transducer coupled to a region of a surface of the substrate, the transducer being responsive to a predetermined frequency having a predetermined wavelength and having a plurality of taps, at least one of the taps having two electrodes opposite and extending toward each other with one of the two electrodes being forked and having tines which are one-sixth wavelength wide and spaced one-sixth wavelength from the other of the two electrodes.

9. The acoustic surface wave device of claim 8 wherein at least one of the plurality of taps has a plurality of series arranged forked electrodes and weighting of the tap is determined by 1/n where n is equal to the number of forked electrodes.

10. An acoustic surface wave device, comprising: a substrate of a material capable of propagating acoustic surface wave energy; and at least one electro-acoustic tranducer coupled to a region of a surface of the substrate, the transducer having two parallel spaced apart bus bars and a plurality of electrodes extending from the bus bars, each individual electrode from one of the bus bars being opposite a corresponding electrode of the other bus bar, one of the electrodes having a forked configuration so that the forked portion surrounds the corresponding opposite positioned electrode, another electrode extending from one of the bus bars being opposite to a first forked electrode extending from the other bus bar wherein a second forked electrode is positioned between the another electrode and the first forked electrode thereby establishing a series of forked electrodes opposite the another electrode.

11. The acoustic surface wave device of claim 10 wherein the transducer is responsive to a predetermined frequency having a predetermined wavelength, and wherein all the electrodes are one-sixth wavelength wide and spacing between the forked portion and the surrounded electrode is one-sixth wavelength.

12. An acoustic surface wave device, comprising: a substrate of a material capable of propagating acoustic surface wave energy; and at least one electro-acoustic transducer coupled to a region of a surface of the substrate, the transducer being responsive to a predetermined frequency having a predetermined wavelength, the transducer having a plurality of taps, the taps having three electrodes wherein two of the electrodes are joined together at one end thereof in a manner to partially surround the third of the three electrodes, all of the electrodes being one-sixth wavelength wide, and the taps being spaced one and a half wavelengths apart.

* * * * *